United States Patent [19]

Estrada

[11] Patent Number: 4,945,263
[45] Date of Patent: Jul. 31, 1990

[54] TTL TO ECL/CML TRANSLATOR CIRCUIT WITH DIFFERENTIAL OUTPUT

[75] Inventor: Julio R. Estrada, South Portland, Me.

[73] Assignee: National Semiconductor Corporation, Santa Clara, Calif.

[21] Appl. No.: 397,769

[22] Filed: Aug. 23, 1989

[51] Int. Cl.$^5$ .......................................... H03K 19/092
[52] U.S. Cl. .................................. 307/475; 307/455; 307/494; 307/362
[58] Field of Search ............... 307/443, 455, 475, 494, 307/362, 264

[56] References Cited

U.S. PATENT DOCUMENTS

| | | | |
|---|---|---|---|
| 4,553,842 | 8/1985 | Yang et al. | 307/455 X |
| 4,607,177 | 8/1986 | Lechner | 307/475 |
| 4,654,549 | 3/1987 | Hannington | 307/443 X |
| 4,684,831 | 8/1987 | Kruest | 307/455 X |
| 4,698,527 | 10/1987 | Matsumoto | 307/455 X |
| 4,736,125 | 4/1988 | Yuen | 307/455 X |
| 4,771,191 | 9/1988 | Estrada | 307/475 |
| 4,806,800 | 2/1989 | Khan | 307/475 |
| 4,857,776 | 8/1989 | Khan | 307/475 |
| 4,883,990 | 11/1989 | Umeki | 307/455 X |

OTHER PUBLICATIONS

Gaudenzi et al., "Level Converter Circuit", *IBM TDB*, vol. 19, No. 2, Jul. 1976, p. 498.
Parker, "Converter Circuit", *IBM TDB*, vol. 17, No. 6, Nov. 1974, p. 1618.

*Primary Examiner*—David Hudspeth
*Attorney, Agent, or Firm*—Lee Patch; Daniel H. Kane

[57] ABSTRACT

A TTL to ECL/CML translator circuit delivers differential or complementary ECL logic output signals in response to TTL input signals with voltage gain, small output voltage swing and with a narrow transition region. The TTL input circuit is coupled to a current mirror circuit with first and second current mirror branch circuits. A differential amplifier gate circuit with differential amplifier first and second gate transistor elements co-acts with the current mirror circuit. The second current mirror branch circuit also constitutes the differential amplifier first gate transistor element. A threshold clamp circuit applies a threshold voltage level at the base node of the differential amplifier second gate transistor element thereby establishing a TTL input threshold at the threshold voltage level. First and second ECL output circuits are coupled to the collector nodes of the differential amplifier first and second gate transistor elements for delivering complementary ECL output signals. The biasing components or elements of the TTL input circuit and threshold clamp circuit are selected for example for an output voltage swing of $1V_{BE}$, a threshold voltage level of $2V_{BE}$, and so that the voltage level at a common emitter node coupling of the current mirror circuit and differential amplifier gate circuit rises to turn off the second gate transistor element when the current mirror is conducting.

19 Claims, 3 Drawing Sheets

TTL TO ECL/CML TRANSLATOR CIRCUIT WITH DIFFERENTIAL OUTPUT

Technical Field

This invention relates to a new transistor-transistor logic (TTL) to emitter coupled logic or current mode logic (ECL/CML) translator circuit for translating TTL logic mode input signals at the TTL input to ECL logic mode output signals at the ECL output. The translator circuit delivers complementary or differential ECL logic output signal high and low potential levels, with voltage gain at the output, with relatively constant ECL logic signal high and low potential levels over a wide range of TTL logic input signal potential levels, and with a small voltage swing between high and low potential levels at the output.

Background Art

A single ended or single output TTL to ECL/CML translator circuit is described by the present inventor in U.S. Pat. No. 4,771,191 issued Sept. 13, 1988. A schematic circuit diagram of this single ended translator circuit illustrated in FIG. 3 of U.S. Pat. No. 4,771,191 is reproduced identically with the same reference numerals in FIG. 1. A simplified block diagram of the prior art translator circuit of FIG. 1 is shown in FIG. 2 with components eliminated except for the major functional blocks of the circuit and resistors R104 and R82.

TTL logic input signal high and low potential levels are received at the TTL input circuit which includes for example diode components 58, 60 and 106, and resistor elements 104 and 102. The logic signal high and low potential levels are applied by the TTL input circuit at the common base node coupling of a current mirror circuit. Current flow is established through the first branch circuit of the current mirror provided by diode 94, a base collector shorted (BCS) transistor element according to the input signals. This current is mirrored in the second branch circuit of the current mirror provided by transistor element 62. The current flow in the branch circuits of the current mirror therefore alternate between two levels according to the input signals. The current mirror configuration avoids saturation of transistor element 62 for high speed switching operation. Furthermore, resistor elements 96 & 98 are biasing resistors which set voltage levels at transistor elements 94 and 62 for fast turn on.

The TTL input circuit operates between the TTL high potential level or power rail $V_{CC}$ or $V_{TTL}$ and the TTL low potential level or power rail GND. The TTL high potential power rail $V_{CC}$ is typically 4.5 or 5.0 volts while the TTL low potential power rail GND is 0 volts. The TTL input circuit also includes an input clamp circuit establishing voltage levels with reference to the TTL low potential level GND. Diode elements 92, 90 and 88 clamp the maximum voltage at the collector node of the current mirror second branch circuit transistor element 62 at for example $3V_{BE}$ above ground potential or 0 v. Diode elements 92 and 94 establish the threshold voltage level at the common base node coupling of the current mirror circuit for switching or transition between ECL logic output signal high and low potential levels at the ECL output. In this example the TTL input threshold is set at $2V_{BE}$.

The ECL output circuit is effectively coupled between the ECL high potential level or power rail GND of 0 v and the ECL low potential level or power rail $V_{EE}$, typically at $-4.5$ v or $-5.0$ v. The ECL output circuit is provided by emitter follower output buffer transistor element 64 coupled to the collector node of the current mirror second branch circuit transistor element 62. The collector node 100 of transistor element 62 provides the output switching node for the ECL output circuit.

The ECL output circuit also includes the level shift circuit provided by diode elements 66 and 68 and resistor element 70 coupled in a stack between the output buffer emitter follower transistor element 64 and the ECL output node 72. An ECL current sink provided by current sourcing transistor element 76 and tail resistor 78 is coupled between the ECL output node 72 and the ECL low potential power rail $V_{EE}$.

The conventional translator circuit performs three functions. First it provides a voltage level shift from the TTL logic input signal high and low potential levels to the ECL logic output signal high and low potential levels. Second it translates the reference for relevant voltage levels from the TTL low potential power rail to the ECL high potential power rail, which potential levels and power rails coincide in this example. Third, the translator circuit makes provision for the transition from TTL transistor elements operating in the saturation operating region to ECL transistor elements operating in the non-saturation operating region. In the circuit of FIG. 1 these functions are performed by the ECL output circuit coupled to the collector node 100 of the current mirror second branch circuit transistor element 62 and by the current mirror circuit. In addition, as further set forth in U.S. Pat. No. 4,771,191, the circuit of FIG. 1 provides voltage gain of the ECL logic output signals over the TTL logic input signals for typical circuit component values of, for example, $A_V=7$. Additional features of the circuit of FIG. 1 are as follows.

By reason of the current mirror circuit configuration in the translator circuit, collector path resistor 82 is the swing resistor which sets the output voltage swing between the ECL logic output signal high and low potential levels. Furthermore, the voltage drop across resistor element 82 is set by the input clamp circuit and the voltage drop across resistor 104. In the preferred example, the components are selected for a voltage drop of approximately $1V_{BE}$ across resistor element 82 establishing a relatively small voltage swing of $1V_{BE}$ between the ECL logic output signal high and low potential levels. This smaller than conventional output swing permits higher speed switching.

Furthermore the circuit arrangement constrains the transition region for switching at the output to within for example approximately 60 mV on either side of the TTL input threshold voltage level of $2V_{BE}$. The ECL logic output signals therefore remain constant and stable over a wide range of TTL logic signal input voltage levels.

While the circuit of FIG. 1 provides additional advantages and functions over other conventional translator circuits, it is limited to a single ended output. In the example of FIG. 1 described in U.S. Pat. No. 4,771,191, the translator circuit is inherently inverting and the ECL output is an inverted output OUTN with respect to the high or low potential level of the TTL logic input signal. There is no readily apparent circuit reconfiguration or rearrangement for obtaining complementary ECL outputs OUT and OUTN while preserving the advantages of the translator circuit of FIG. 1 in providing voltage gain, small output swing voltage for higher speed switching, and a narrow transition region maintaining constant and stable high and low potential levels at the ECL output over a wide range of TTL logic input signal voltage level variations.

Objects of the Invention

It is therefore an object of the present invention to provide a new TTL to ECL/CML translator circuit which delivers complementary or differential ECL logic output signal high and low potential levels in response to TTL logic input signals.

Another object of the invention is to provide a TTL to ECL/CML translator circuit with complementary or differential outputs which preserves the features and advantages of the single ended output translator circuit described in U.S. Pat. No. 4,771,191.

Thus the invention seeks to provide a TTL to ECL/CML translator circuit with voltage gain, small output swing, and narrow transition region while also delivering complementary or differential outputs.

Disclosure of the Invention

In order to accomplish these results the invention provides a TTL input circuit for receiving TTL logic signals of high and low potential level and a current mirror circuit with first and second current mirror branch circuits coupled with a common emitter node coupling. The first and second current mirror branch circuits are also coupled with a common base node coupling in turn connected to the TTL input circuit. The TTL input circuit is formed with bias circuit elements operatively coupled to the current mirror circuit for causing the first current mirror branch circuit to be substantially conducting and non-conducting respectively in response to TTL logic signal high and low potential levels at the TTL input circuit. The second current mirror branch circuit mirrors the current in the first current mirror branch circuit.

According to the invention, a differential amplifier gate is provided with differential amplifier first and second gate transistor elements having emitter nodes coupled to the common emitter node coupling. Importantly, the differential amplifier first gate transistor element constitutes the second current mirror branch circuit. A current sink resistor element is coupled to the common emitter node coupling and provides a feedback biasing element for biasing feedback control of the second gate transistor element.

The invention also provides a threshold clamp circuit coupled to a base node of the differential amplifier second gate transistor element for applying a threshold voltage level intermediate between high and low potential levels applied at a base node of the differential amplifier first transistor element. The threshold clamp circuit thereby establishes the TTL input threshold at this threshold voltage level. One of the first and second gate transistor element is relatively conducting and the other is relatively non-conducting according to the TTL logic signal high and as a result of low potential levels applied at the TTL input circuit and the consequent feedback bias levels established across the current sinking resistor element at the common emitter node coupling.

According to the invention, complementary first and second ECL output circuits are coupled respectively to the collector nodes of the differential amplifier first and second gate transistor elements. The collector nodes provide the output switching nodes for the differential ECL output circuits. Each ECL output circuit comprises an output buffer emitter follower transistor element coupled to a collector node of one of the first and second gate transistor elements. A level shift circuit couples the output buffer emitter follower transistor element to a respective complementary ECL output. An ECL current sink is coupled to the respective ECL output.

For defining the output swing voltage of the respective complementary ECL outputs, first and second swing resistor elements are coupled at one end respectively to the collector nodes of the differential amplifier first and second gate transistor elements. The other end of each of the first and second swing resistor elements is coupled through voltage level shift components both to the threshold clamp circuit and to the TTL input circuit. The threshold clamp circuit through the voltage level shift components clamps the maximum voltage level at the collector nodes of the respective first and second gate transistor elements to selected voltage levels above the threshold voltage level. Furthermore the threshold clamp circuit and the TTL input circuit through biasing components determine the swing voltage drop across the respective first and second swing resistor elements.

A feature and advantage of the differential amplifier first and second gate transistor elements integrated with the current mirror first and second branch circuits according to the invention is that the defined voltage drop across the first and second swing resistor elements in turn define the output voltage swing for complementary or differential ECL logic output signals. At the same time the co-acting and cooperating current mirror and differential amplifier circuits afford voltage gain, small output swing, and narrow transition regions for both the complementary or differential ECL outputs.

In the preferred example embodiment the TTL input bias circuit elements and the threshold circuit elements are selected and arranged so that the voltage drop across the first swing resistor element coupled to the collector node of the first gate transistor element when the gate transistor element is conducting is approximately $1V_{BE}$ or a fraction of $1V_{BE}$ such as $\frac{2}{3} V_{BE}$. The voltage drop across the second swing resistor element is similarly established by the threshold clamp circuit and TTL input circuit. As a result the output swing of the complementary ECL outputs is limited to $1V_{BE}$ or a fraction of $1V_{BE}$ such as $\frac{2}{3} V_{BE}$ for fast switching operation.

According to another feature of the invention the resistance value of the second swing resistor element coupled to the collector node of the second gate transistor element is substantially equal to the resistance value of the current sink resistor element at the common emitter node coupling or a fraction of the resistance value such as $\frac{2}{3}$ the resistance. A feature of this arrangement is that when the first and second current mirror branch circuits turn on and are conducting in response to a TTL logic input signal high potential level at the TTL input circuit, the voltage drop across the current sink resistor element at the common emitter node coupling raises the potential level at the common emitter node coupling to a level so that the second gate transistor element substantially turns off and remains relatively non-conducting. The first and second gate transistor elements thereby provide a differential amplifier gate.

In the preferred example, the threshold circuit elements are selected and arranged so that the threshold voltage level applied at the base node of the second transistor element is set at approximately $2V_{BE}$. As a result the TTL input threshold is set at $2V_{BE}$ with voltage swings across the first and second swing resistor elements and output swings at the complementary ECL outputs of $\frac{2}{3} V_{BE}$. By this and other arrangements of the circuit the traditional translator circuit functions are achieved with complementary ECL outputs as well as voltage gain and small output swing with narrow transition regions.

Other objects, features and advantages of the invention are apparent in the following specification and accompanying drawings.

Description of the Preferred Example Embodiments and Best Mode of the Invention

Figure 3:
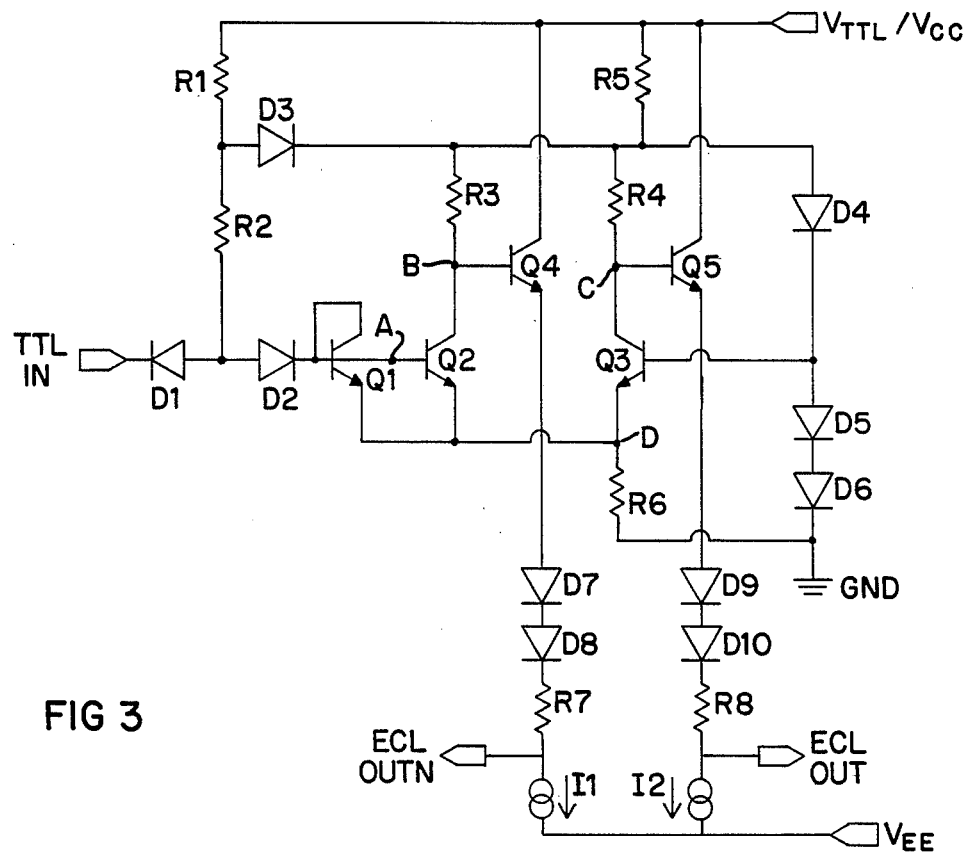
FIG. 3 is a schematic circuit diagram of a TTL to ECL/CML translator circuit according to the invention with complementary or differential ECL outputs.
Figure 4:
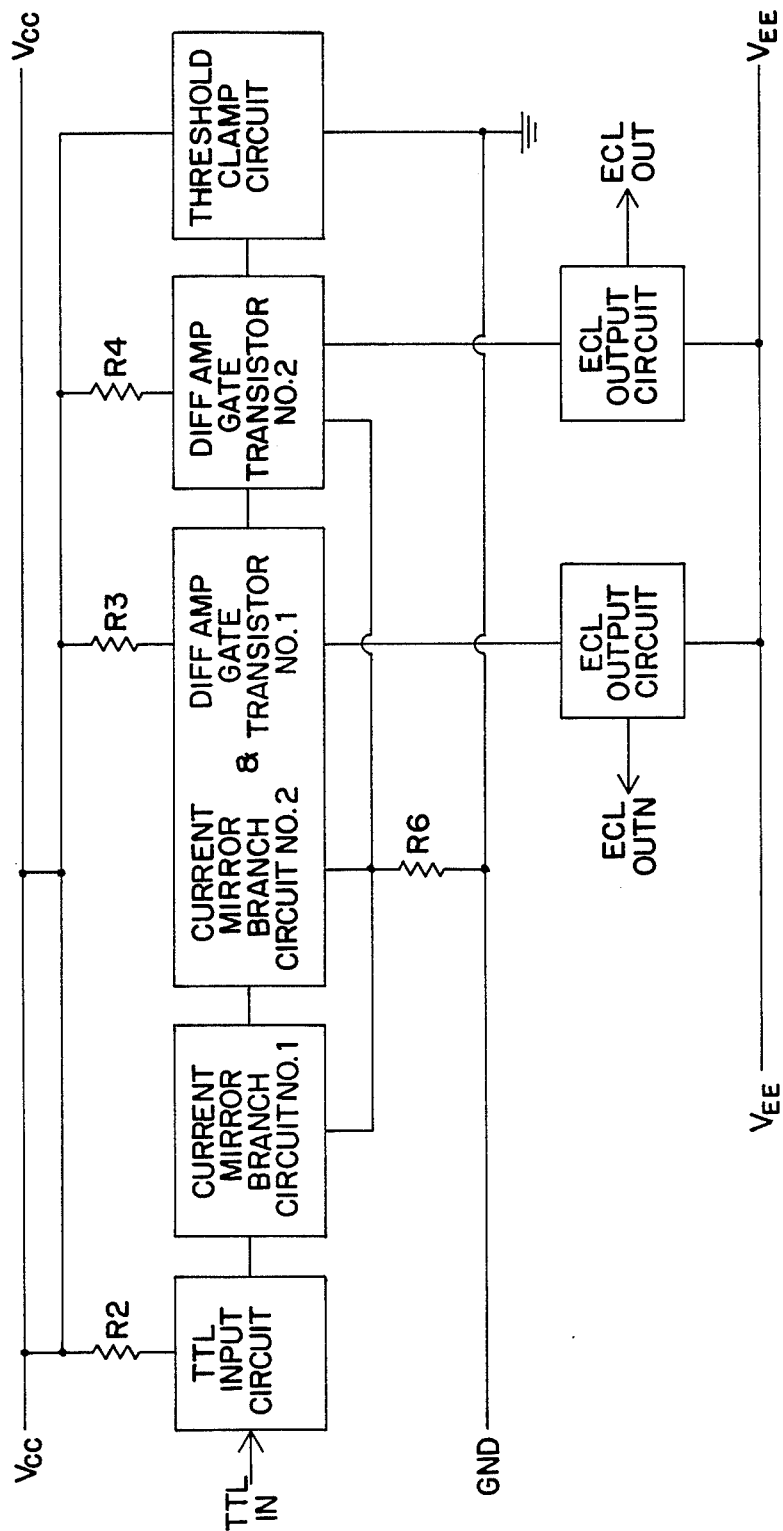
FIG. 4 is a simplified block diagram of the translator circuit of FIG. 3 with all components removed except the major functional blocks and resistors R2, R3, R4 and R6.

A TTL to ECL/CML translator circuit delivering complementary ECL logic output signals according to the invention is illustrated in FIG. 3 with a simplified block diagram of the circuit shown in FIG. 4. TTL logic input signals are received at the TTL input circuit which includes diode elements D1, D2 and D3 and voltage divider resistor elements R1 and R2. The TTL input circuit is coupled between the TTL high potential power rail $V_{CC}$ with a voltage level of for example 5.0 v, and the TTL low potential power rail GND with a voltage level of for example 0 v. TTL logic input signal high and low potential levels are applied at the common base node coupling A of the current mirror circuit with first and second branch circuits provided by transistor elements Q1 and Q2.

Transistor element Q1 provides the first branch circuit of the current mirror and is a BCS transistor element diode. The first branch circuit diode Q1 is conducting when a TTL logic input signal high potential level appears at the TTL input. Diode Q1 is substantially non-conducting in response to a TTL logic input signal of low potential at the TTL input. The second branch circuit of the current mirror provided by transistor element Q2 mirrors the current in the first branch circuit. The transistor elements Q1 and Q2 are coupled together with a common emitter node coupling D which is connected through current sink resistor element R6 to the ground potential power rail GND.

Co-acting with the current mirror circuit in the translator circuit is a differential amplifier gate provided by first and second gate transistor elements Q2 and Q3. The current mirror second branch circuit transistor element Q2 provides the differential amplifier first gate transistor element Q2. The first and second gate transistor element Q2 and Q3 are coupled together at the common emitter node coupling D. The collector nodes B and C of first and second gate transistor elements Q2 and Q3 are coupled respectively to swing resistor elements R3 and R4, in turn coupled through resistor element R5 to the TTL high potential power rail $V_{CC}$.

The TTL input threshold, the threshold voltage applied at the base node of the differential amplifier second gate transistor element Q3 is established by a threshold clamp circuit. The threshold clamp circuit includes a diode stack of, for example, BCS transistor element diodes D5 and D6 coupled between the base node of transistor element Q3 and the TTL low potential power rail GND. It is apparent that the diode stack with voltage drops of $1V_{BE}$ across diode elements D5 and D6 establishes a threshold voltage level of $2V_{BE}$ at the base node of the second gate transistor element Q3 which in turn establishes a TTL input threshold of $2V_{BE}$ for switching of the complementary ECL outputs as hereafter described.

The translator circuit provides first and second ECL output circuits for delivering the complementary or differential ECL outputs. The first ECL output circuit is provided by emitter follower output buffer transistor element Q4 coupled to the collector node B of the first gate transistor element Q2. A first level shift circuit is provided by BCS transistor element diodes D7 and D8 and level shift resistor element R7 coupled in series in a stack between the emitter follower transistor element Q4 and the complementary or inverse ECL output OUTN. A first ECL output current sink I1 couples the inverse ECL output OUTN to the ECL low potential power rail $V_{EE}$. Current sink I1 is a current source transistor element with a current source voltage supply and tail resistor.

The second ECL output circuit is provided by output buffer emitter follower transistor element Q5 coupled to the collector node C of the second gate transistor element Q3. A second level shift circuit is provided by BCS transistor element diodes D9 and D10 and level shift resistor element R8 coupled in series in a stack between the emitter follower transistor element Q5 and the direct ECL output OUT. A second ECL output current sink I2 couples the direct ECL output OUT to the ECL low potential power rail $V_{EE}$. ECL current sink I2 is also a current source transistor element with current source voltage supply and tail resistor element.

Bias voltage levels within the translator circuit are further established as follows. The threshold circuit includes additional BCS transistor element diode D4 coupled to the swing resistor elements R3 and R4 which are in turn coupled to the collector nodes B,C of the differential amplifier first and second gate transistor elements Q2 and Q3. The threshold clamp circuit therefore not only clamps the threshold voltage level of 2 $\phi(\phi=V_{BE})$, but also clamps the maximum voltage level of the collector nodes B,C at $3\phi$. Following the current loop from ground potential GND through diodes D6, D5, D4 and D3, the return loop to ground follows resistor element R2, diode element D2, one of the base emitter junctions $V_{BE}$ of the current mirror branch circuits and resistor element R6 to ground potential.

The threshold clamp circuit establishes a voltage drop of $1V_{BE}$ across current sink resistor element R6. It is apparent that the bias circuit components or elements of the TTL input circuit and threshold clamp circuit have been selected so that the voltage drop across resistor R2 is $1V_{BE}$ or $1\phi$. When current mirror transistor elements Q1 and Q2 are conducting, the collector current $I_CQ1$ through the current mirror first branch transistor element Q1 is therefore $1\phi/R2$. If the ratio of emitter areas of transistor element Q2 to Q1 is selected to be 2, the collector current $I_CQ2$ through the current mirror second branch transistor element Q2 (which is also the differential amplifier first gate transistor element) is $2\phi/R2$. The combined current $I_{R6}$ when Q1 and Q2 are conducting is therefore $3\phi/R2$. When the second gate transistor element Q3 is conducting, the collector current $I_CQ3$ is $1\phi/R6$, which is also the current $I_{R6}$ through the current sinking resistor element R6.

Solution for the values of swing resistor elements R3 and R4 is as follows. The voltage drop $V_{R3}$ across swing resistor R3 is:

$$V_{R3} = 2\phi \cdot R3/R2$$

The voltage drop $V_{R3}$ establishes the swing voltage at the output and is selected to be, for example $\tfrac{2}{3}\phi$ for fast switching. Substituting and solving for R2:

$$2\phi/3 = 2\phi \cdot R3/R2$$

$$R2 = R3$$

For the desired current levels, R3 is 1K and R2 is 3K ohms. It is desireable that the swing voltage drop $V_{R6}$ across swing resistor R4 be the same as $V_{R3}$.

$$V_{R4} = \phi \cdot R4/R6 = 2\phi \cdot R3/R2$$

Solving for R4:
$$R4 = 2 \cdot R3 \cdot R6/R2$$

R6 is selected to be 1K for the desired current level through R6, and R2 is 3K.

$$R4 = \tfrac{2}{3} R3 = 666\Omega.$$

Exemplary circuit resistor values are summarized in TABLE I.

TABLE I

| R1 | 3.84K |
|----|-------|
| R2 | 3K |
| R3 | 1K |
| R4 | 666 Ω |
| R5 | 2.4K |
| R6 | 1K |

With a TTL logic input signal low potential level at the TTL input, node A is also at the low potential level of for example near 0 v. Without current passing through the current mirror branch circuits, collector node B of the first gate transistor element is at the $3V_{BE}$ or $3\phi$ level clamped by the threshold clamp circuit through diode elements D6, D5 and D4. With the threshold voltage level of $2V_{BE}$ or $2\phi$ applied at the base node of the second gate transistor element Q3, transistor element Q3 is conducting. The collector node C of the second gate transistor element Q3 is therefore at $2\phi$ above ground potential GND. The common emitter coupling node D is at $1\phi$ above ground potential GND as a result of the $1\phi$ voltage drop across current sink resistor element R6.

At the complementary ECL output circuit which delivers the complementary ECL output OUTN, the $3\phi$ potential level at collector node B drops through a $3V_{BE}$ potential drop through the base emitter junction of emitter follower transistor element Q4 and diode elements D7 and D8 to approximately 0 potential at resistor element R7. Level downshift resistor element R7 therefore establishes the ECL logic output signal high potential level in the negative voltage range at complementary ECL output OUTN. This ECL logic output signal high potential level is the inverse output from the TTL logic input signal low potential level and is set by the resistance value of R7 and the current generated by current sink I1.

The direct ECL output circuit which delivers the direct ECL output OUT drops from the potential level of $2\phi$ at collector node C through the base emitter junction of emitter follower transistor element Q5 and diode elements D9 and D10 to a potential level of approximately $-1\phi$ below 0V at resistor element R8. The resistance value of R8 is selected to be substantially the same as R7 so that the ECL logic output signal low potential level is $1\phi$ below the high potential level. The direct ECL output OUT at low potential level corresponds in phase with the TTL logic input signal low potential level.

Upon transition to a TTL logic input signal high potential level at the TTL input, node A rises to the TTL input threshold voltage level of $2V_{BE}$ or $2\phi$. The current mirror first and second branch circuits become conducting with emitter currents of $1\phi/R2$ and $2\phi/R2$ respectively passing through the current mirror branch circuit transistor elements Q1 and Q2. The voltage level at collector node B of the first gate transistor element Q2 therefore drops from $3\phi$ to $2\phi$. The combined current mirror emitter currents of $3\phi/R2$ at the common emitter node coupling from the current mirror branch circuits seeks to join the current $1\phi/R6$ still momentarily conducting through the second gate transistor element Q3. The transient surge of this large combined current through current sink resistor element R6 temporarily raises the voltage level at node D above $1V_{BE}$ or $1\phi$ effectively turning off the second gate transistor element Q3 and the third current component $1\phi/R6$ passing through transistor element Q3. As a result the final current through current sink resistor element R6 is $I_{R6} = 3\phi/R2$ plus a slight leakage current through transistor element Q3 which produces the feedback bias across resistor element R6. It is this mechanism of the co-acting current mirror circuit and differential amplifier gate circuit which alternately switches the first and second gate transistor elements to provide the complementary ECL outputs.

With collector node B at voltage level $2\phi$ the complementary or inverse ECL output OUTN is at the ECL logic output signal low potential level. With the second gate transistor element Q3 not conducting, collector node C rises to voltage level $3\phi$ and the direct ECL output OUT is at the ECL logic output signal high potential level.

In establishing the relative voltage levels it is apparent that the biasing components and elements of the TTL input circuit and threshold clamp circuit set the voltage drop across resistor element R2 at $1\phi$. In turn, resistor element R2 sets the swing voltage drop across the first swing resistor element R3 at $2\phi/3$. The resistance of the second swing resistor element R4 is selected give substantially the same swing voltage drop of approximately $2\phi/3$.

It is noted that switching of the TTL logic input signals between low and high potential levels controls and switches the current level through the current sink resistor element and biasing element R6 between different levels. There is a momentary surge of current from both the current mirror branch circuits and the differential amplifier gate transistor elements through resistor element R6. The voltage shift at node D caused by the current surge effectively introduces negative feedback to the differential amplifier second gate transistor element Q3. The parameters are selected to give a sufficient voltage shift at node D to change the conducting state of gate transistor element Q3, for example, by at least a factor of 10, effectively turning it off.

According to the Ebers-Molt equation for semiconductor emitter current, a voltage shift at node D of 60 mV above $\phi$ will cause a decrease in emitter current through gate transistor element Q3 of a factor of ten. The parameters are therefore selected so that the initial surge of current through current sink resistor element R6 causes change in conduction of at least a factor of 10. Continuing feedback is then provided by the slightly increased voltage level at Node D effected by the shift in current levels, in turn caused by the leakage current through Q3.

By way of example, the voltage drop $V_{R6}$ across current sinking and biasing resistor R6 is $1\phi$, approximately equal to 0.8 v or 800 mV, when Q3 is conducting. R6 is selected to be 1K for a current $I_{R6}$:

$$I_{R6} = \phi/R6 = 800 \text{ mV}/1000\Omega = 0.8 \text{ mA}$$

When Q1 and Q2 are conducting the basic current $I_{R6}$ is similarly:

$$I_{R6} = 3\phi/R2 = 800 \text{ mV} \times 3/3000\Omega = 0.8 \text{ mA}$$

plus the leakage current $\Delta I_{R6}$ through Q3. With a total voltage drop $V_{R6} + \Delta V_{R6}$ across R6 and an increment $\Delta V_{R6}$ of at least 60 mV, the current contributed by Q3 is reduced by factor of 10 from 0.8 mA to 0.08 mA. The total current $I_{R6} + \Delta I_{R6}$ across R6 while Q1 and Q2 are conducting is therefore 0.88 mA. The voltage drop $V_{R6} + \Delta V_{R6}$ of 860 mV provides the continuing negative feedback that effectively debiases the second gate transistor element Q3 in a relatively non-conducting state.

Figure 1:
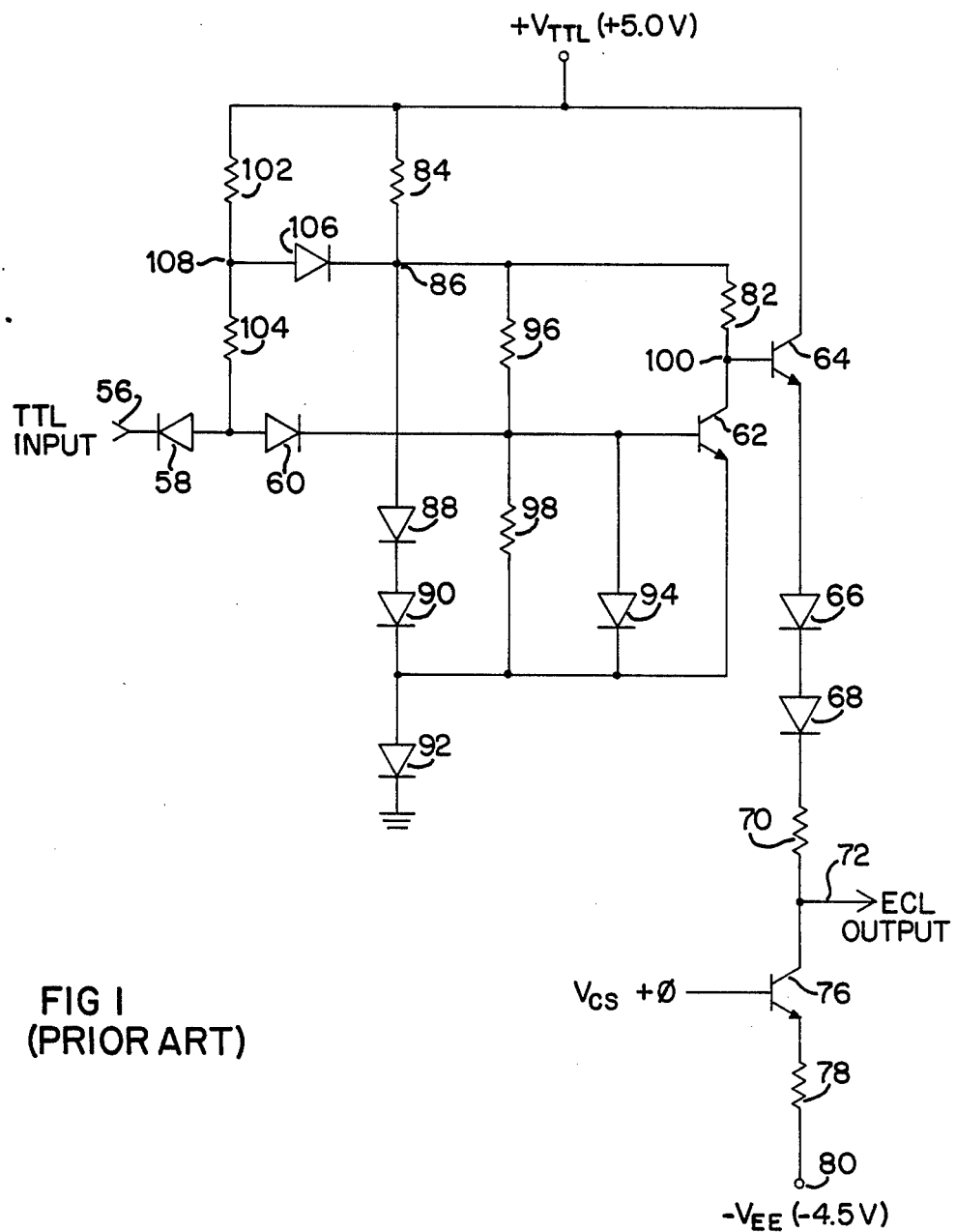
FIG. 1 is a schematic circuit diagram of a prior art TTL to ECL/CML translator circuit with single ended output, being an identical reproduction of FIG. 3 of U.S. Pat. No. 4,771,191.
Figure 2:
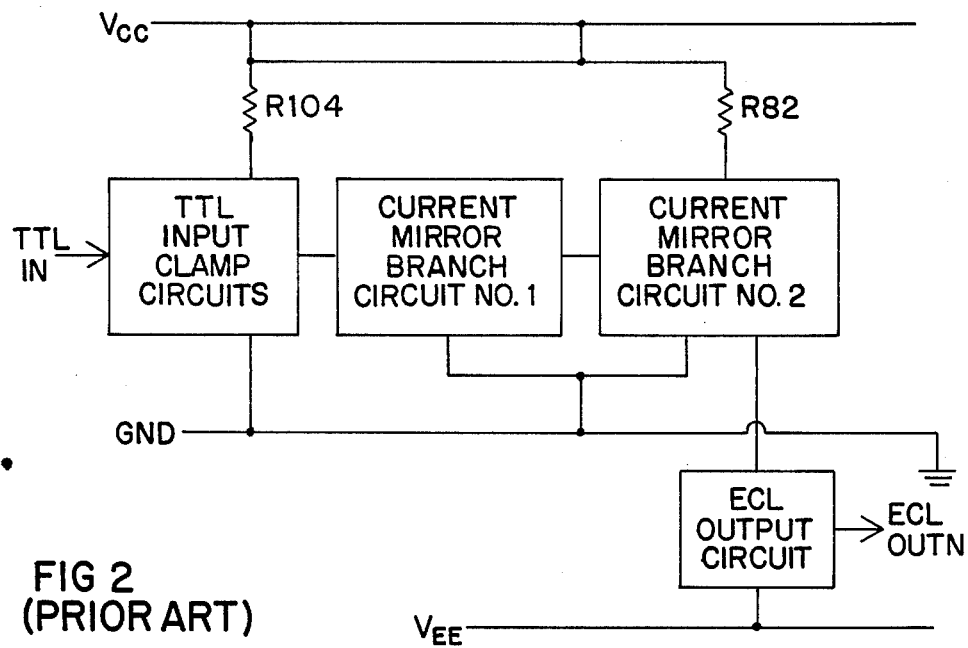
FIG. 2 is a simplified block diagram of the prior art translator circuit of FIG. 1 with all components removed except the major functional blocks of the circuit and resistors R104 and R82.

In a further embodiment of the invention, biasing resistor elements similar to resistors 96 and 98 of FIG. 1 may be added to the circuit of FIG. 3. Thus a biasing resistor may be added between the emitter node of the current mirror first branch circuit transistor element Q1 and its base node A analogous to resistor 98 of FIG. 1. A biasing resistor may also be added between the emitter node of Q1 and the cathode of diode element D3, analogous to resistor element 96 of FIG. 1. These resistor element values are selected so that the current mirror transistor elements Q1 and Q3 of FIG. 3 are biased at the verge of turning on for fast switching and turn on of the current mirror in response to a TTL logic signal high potential level at the TTL input.

While the invention is described with reference to particular example embodiments it is intended to cover all modifications and equivalents within the scope of the following claims.

I claim:

1. A differential output TTL to ECL/CML translator circuit for delivering complementary ECL logic output signals in response to TTL logic input signals comprising:

a TTL input circuit for receiving TTL logic signals of high and low potential level;

a current mirror circuit comprising first and second current mirror branch circuits with a common emitter node coupling, said first and second current mirror branch circuits having a common base node coupling coupled to the TTL input circuit;

said TTL input circuit having bias circuit elements operatively coupled to the current mirror circuit for causing the first current mirror branch circuit to be substantially conducting and non-conducting respectively in response to TTL logic signal high and low potential levels at the TTL input circuit, said second current mirror branch circuit mirroring the current in the first current mirror branch circuit;

a differential amplifier gate comprising differential amplifier first and second gate transistor elements having emitter nodes coupled to said common emitter node coupling, and a current sinking bias feedback resistor element coupled to the common emitter node coupling, said differential amplifier first gate transistor element being the second current mirror branch circuit;

a threshold clamp circuit coupled to a base node of the differential amplifier second gate transistor element for applying a threshold voltage level, one of said first and second gate transistor elements being relatively conducting and the other being relatively non-conducting according to the TTL logic input signal high and low potential levels applied at the TTL input circuit;

and complementary first and second ECL output circuits coupled respectively to collector nodes of the differential amplifier first and second gate transistor elements.

2. The translator circuit of claim 1 further comprising first and second swing resistor elements having one end coupled respectively to the collector node of one of the differential amplifier first and second gate transistor elements, the other end of said first and second swing resistor elements each being coupled through voltage level shift means to the threshold clamp circuit and to the TTL input circuit.

3. The translator circuit of claim 2 wherein the threshold clamp circuit is operatively coupled through the voltage level shift means for clamping the maximum voltage level at the collector nodes of the respective first and second gate transistor elements to selected voltage levels above the threshold voltage level.

4. The translator circuit of claim 2 wherein the TTL input circuit bias circuit elements are selected and arranged so that the swing voltage drop across the first swing resistor element coupled to the collector node of the first gate transistor element when the gate transistor element is conducting is approximately $\leq 1 V_{BE}$.

5. The translator circuit of claim 4 wherein the resistance value of the second swing resistor element coupled to the collector node of the second gate transistor element is selected to give substantially the same swing voltage drop across the second swing resistor element $\leq 1 V_{BE}$.

6. The translator circuit of claim 2 wherein the TTL input circuit bias circuit elements and the threshold clamp circuit are selected and arranged so that when the first and second current mirror branch circuits are conducting in response to a TTL logic input signal high potential level at the TTL input circuit, the voltage drop across the current sinking and bias feedback resistor element at the common emitter node coupling raises the potential level at the common emitter node coupling to a level causing the second gate transistor element to be relatively non-conducting.

7. The translator circuit of claim 6 wherein the voltage drop across the current sinking bias feedback resistor element causes reduction in current through the second gate transistor element by at least a factor of ten.

8. The translator circuit of claim 2 wherein the TTL input circuit bias circuit elements and the threshold clamp circuit elements are selected and arranged so that the voltage drop across the respective first and second swing resistor elements when the respective first and second gate transistor elements are conducting is approximately $\leq 1V_{BE}$, and wherein the complementary first and second ECL output circuits deliver ECL logic output signal high and low potential levels at the respective complementary ECL outputs, whereby the voltage swing between the ECL logic output signal high and low potential levels is approximately $\leq 1V_{BE}$.

9. The translator circuit of claim 8 wherein the threshold clamp circuit elements are selected and arranged so that the threshold voltage level applied at the base node of the second gate transistor element and therefore the TTL input threshold are set at approximately $2V_{BE}$.

10. A differential output TTL to ECL/CML translator circuit for delivering complementary ECL logic output signals at complementary ECL output circuits in response to TTL logic input signals at a TTL input circuit, said TTL input circuit being operatively coupled between a relatively high TTL potential level $V_{CC}$ and relatively low TTL potential level GND, said TTL logic input signals comprising TTL logic high and low potential levels in the positive voltage range referenced to the relatively low TTL potential level GND, said complementary ECL output circuits being operatively coupled between a relatively high ECL potential level GND and relatively low ECL potential level $V_{EE}$, said complementary ECL output signals comprising ECL logic high and low potential levels in the negative voltage range referenced to the relatively high ECL potential GND, comprising:

a current mirror circuit comprising first and second current mirror branch circuits with a common emitter node coupling, said first and second current mirror branch circuits having a common base node coupling coupled to the TTL input circuit;

said TTL input circuit having bias circuit elements operatively coupled to the current mirror circuit for causing the first current mirror branch circuit to be relatively conducting and non-conducting respectively in response to TTL logic input signals of high and low potential level at the TTL input, said second current mirror branch circuit mirroring the current in the first current branch circuit;

a differential amplifier gate comprising differential amplifier first and second gate transistor elements with emitter nodes coupled to said common emitter node coupling, and a current sink resistor element coupled between the common emitter node coupling and potential level GND, said differential amplifier first gate transistor element being the second current mirror branch circuit;

a threshold clamp circuit coupled to a base node of the differential amplifier second gate transistor element for applying a threshold voltage level, one of the first and second gate transistor elements being relatively conducting and the other being relatively non-conducting according to the TTL logic input signal high and low potential levels applied at the base node of the first gate transistor element;

first and second swing resistor elements coupled at one end respectively to a collector node of the differential amplifier first and second gate transistor elements, said first and second swing resistor elements each being coupled at the other end through voltage level shift means to both the threshold clamp circuit and to the TTL input circuit;

and complementary first and second ECL output circuits, coupled respectively to the collector nodes of the differential amplifier first and second gate transistor elements, said complementary first and second ECL output circuits delivering level shifted and translated complementary ECL logic output signals in response to TTL logic input signal high and low potential levels applied at the TTL input circuit.

11. The translator circuit of claim 10 wherein the first swing resistor element is coupled to the collector node of the first gate transistor element, wherein the second swing resistor element is coupled to the collector node of the second gate transistor element, and wherein the resistance values of the respective first and second swing resistor elements are selected so that the voltage drop across the first and second swing resistor elements when the respective first and second gate transistor elements are conducting is approximately $\leq 1V_{BE}$.

12. The translator circuit of claim 10 wherein the TTL input circuit bias circuit elements and the threshold clamp circuit are selected and arranged so that when the current mirror first and second branch circuits are conducting in response to a TTL logic input signal high potential level, the voltage drop across the current sink resistor element at the common emitter node coupling raises the potential level at the common emitter node coupling so that the second gate transistor element is relatively non-conducting.

13. The translator circuit of claim 12 wherein the voltage drop across the current sink resistor element causes reduction in current through the second gate transistor element by at least a factor of ten.

14. The translator circuit of claim 10 wherein the threshold clamp circuit is operatively coupled through voltage level shift means to the collector nodes of the respective first and second gate transistor elements for clamping the maximum high potential level at said collector nodes of the first and second gate transistor elements.

15. The translator circuit of claim 10 wherein the TTL input circuit comprises voltage divider bias circuit elements for establishing a voltage drop of approximately $1V_{BE}$ across the first swing resistor element coupled to the collector node of the first gate transistor element when the first gate transistor element is conducting.

16. The translator circuit of claim 10 wherein the threshold clamp circuit comprises a diode stack operatively coupled between the base node of the second gate transistor element and the relatively low TTL potential level GND, and wherein the threshold clamp circuit comprises further level shift means operatively coupled between the base node of the second gate transistor element and the respective collector nodes of the first and second gate transistor elements for clamping the maximum voltage level at the collector nodes of the first and second gate transistor elements to a selected level above the threshold level.

17. The translator circuit of claim 16 wherein the TTL input circuit bias circuit elements and the threshold clamp circuit are selected and arranged so that the voltage drop across each of the respective first and second swing resistor elements coupled respectively to the collector nodes of the first and second gate transistor elements when the first and second gate transistor elements respectively are conducting is approximately $\leq 1V_{BE}$, whereby the swing voltage between the ECL logic output signal high and low potential levels is approximately $\leq 1V_{BE}$.

18. The translator circuit of claim 17 wherein the threshold clamp circuit diode stack is selected and arranged so that the threshold voltage level clamped at the base node of the second gate transistor element is approximately $2V_{BE}$.

19. A differential output TTL to ECL/CML translator circuit for delivering complementary ECL logic output signals in response to TTL logic input signals and having a TTL input circuit for receiving TTL logic signals of high and low potential level, and a current mirror circuit comprising first and second current mirror branch circuits with a common emitter node coupling, said first and second current mirror branch circuits having a common base node coupling coupled to the TTL input circuit, said first current mirror branch circuit being substantially conducting and non-conducting respectively in response to TTL logic signal high and low potential levels at the TTL input circuit, said second current mirror branch circuit mirroring the current in the first current mirror branch circuit, said translator circuit also having a first ECL output circuit coupled to a collector node of the first current mirror branch circuit, the improvement comprising:

a differential amplifier gate comprising differential amplifier first and second gate transistor elements having emitter nodes coupled to said common emitter node coupling, and a current sinking bias element coupled to the common emitter node coupling, said second current mirror branch circuit constituting the differential amplifier first gate transistor element;

a threshold clamp circuit coupled to a base node of the differential amplifier second gate transistor element for applying a threshold voltage level intermediate between high and low potential levels applied at a base node of a differential amplifier first transistor element, one of said first and second gate transistor elements being relatively conducting and the other being relatively non-conducting according to the TTL logic input signal high and low potential levels applied at the TTL input circuit;

and a second ECL output circuit coupled to a collector node of the differential amplifier second gate transistor element for providing complementary ECL outputs with the first ECL output circuit.

* * * * *